US011804921B2

(12) United States Patent
Chapman et al.

(10) Patent No.: US 11,804,921 B2
(45) Date of Patent: Oct. 31, 2023

(54) METHOD AND APPARATUS FOR HIGH PRECISION TIME STAMPING

(71) Applicant: CISCO TECHNOLOGY, INC., San Jose, CA (US)

(72) Inventors: Matthew Chapman, Coogee (AU); Ka-Shu Wong, Chatswood (AU)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/619,611

(22) PCT Filed: Jun. 18, 2020

(86) PCT No.: PCT/IB2020/055732
§ 371 (c)(1),
(2) Date: Dec. 16, 2021

(87) PCT Pub. No.: WO2020/261066
PCT Pub. Date: Dec. 30, 2020

(65) Prior Publication Data
US 2022/0303036 A1  Sep. 22, 2022

(30) Foreign Application Priority Data

Jun. 25, 2019 (AU) ................................ 2019902218

(51) Int. Cl.
*H04J 3/06* (2006.01)
(52) U.S. Cl.
CPC .................... *H04J 3/0685* (2013.01)
(58) Field of Classification Search
CPC ............................ H04J 3/0685; G01R 25/00
See application file for complete search history.

(56) References Cited

U.S. PATENT DOCUMENTS 5,457,428 A  10/1995 Alder et al.
5,953,345 A   9/1999 Findlater et al.
(Continued)

FOREIGN PATENT DOCUMENTS

AU   2013101670 B4   1/2014
EP      1564919 B1  10/2006
(Continued)

OTHER PUBLICATIONS

Maciej Lipinski et al., "Performance results of the first White Rabbit installation for CNGS time transfer", 2012 IEEE International Symposium on Precision Clock Synchronization for Measurement, Control and Communication Proceedings. IEEE, Apr. 2012, 6 pages.
(Continued)

*Primary Examiner* — Jae Y Lee
(74) *Attorney, Agent, or Firm* — Edell, Shapiro & Finnan, LLC

(57) ABSTRACT

Disclosed is a method of determining time in a digital processing system, comprising, in a present cycle of a first digital clock: accessing a reference time counter for a reference digital clock, wherein the reference time counter increments in value by a fixed amount at every cycle of the reference digital clock, the reference digital clock being of a higher accuracy than the first digital clock; accessing a first time counter for the first digital clock, wherein the first time counter increments in value by an updatable increment amount at each cycle of the first digital clock; and comparing at least one part of the reference time counter with at least one corresponding part of the first time counter. Based on the comparing, an adjustment is made to one or more attributes of the first time counter, so that first time counter at least approximates the reference time counter.

29 Claims, 7 Drawing Sheets

(56) References Cited

U.S. PATENT DOCUMENTS

| | | | |
|---|---|---|---|
| 6,144,714 | A | 11/2000 | Bleiweiss et al. |
| 6,278,710 | B1 | 8/2001 | Eidson |
| 8,036,202 | B2 | 10/2011 | Biederman et al. |
| 8,598,910 | B1 | 12/2013 | Leshchuk et al. |
| 8,949,448 | B1 | 2/2015 | Saxtorph |
| 9,112,632 | B2 | 8/2015 | Finn |
| 9,268,888 | B1 | 2/2016 | Leong et al. |
| 9,665,148 | B2 | 5/2017 | Hamdi et al. |
| 2002/0073228 | A1 | 6/2002 | Net et al. |
| 2003/0235216 | A1 | 12/2003 | Gustin |
| 2005/0050203 | A1 | 3/2005 | Chattopadhyay et al. |
| 2005/0207387 | A1 | 9/2005 | Middleton et al. |
| 2005/0286507 | A1 | 12/2005 | Osterling et al. |
| 2006/0007960 | A1 | 1/2006 | Liu et al. |
| 2007/0100570 | A1 | 5/2007 | Xu |
| 2007/0260906 | A1* | 11/2007 | Corredoura ............... G06F 1/12 713/400 |
| 2008/0273521 | A1 | 11/2008 | Shao et al. |
| 2010/0074383 | A1 | 3/2010 | Lee et al. |
| 2010/0150288 | A1 | 6/2010 | Zhu et al. |
| 2011/0075685 | A1 | 3/2011 | Xu et al. |
| 2012/0139597 | A1 | 6/2012 | Blondel et al. |
| 2013/0003757 | A1 | 1/2013 | Boatright et al. |
| 2013/0343409 | A1 | 12/2013 | Haulin |
| 2014/0132837 | A1 | 5/2014 | Ye et al. |
| 2014/0149526 | A1* | 5/2014 | Magee ................ H04L 43/0864 709/208 |
| 2015/0134864 | A1 | 5/2015 | Foster |
| 2015/0163000 | A1 | 6/2015 | Aweya |
| 2016/0020985 | A1 | 1/2016 | Swartzentruber et al. |
| 2016/0043823 | A1 | 2/2016 | Zhao et al. |
| 2017/0085422 | A1 | 3/2017 | Chapman |
| 2017/0288801 | A1* | 10/2017 | Aweya .................. H04J 3/0661 |
| 2018/0107579 | A1 | 4/2018 | Chapman |

FOREIGN PATENT DOCUMENTS

| | | |
|---|---|---|
| WO | 2009029339 A1 | 3/2009 |
| WO | 2017054030 A1 | 4/2017 |
| WO | 2019023731 A1 | 2/2019 |

OTHER PUBLICATIONS

Pedro Moreira et al., "Distributed DDS in a White Rabbit Network: An IEEE 1588 Application", 2012 IEEE International Symposium on Precision Clock Synchronization for Measurement, Control and Communication Proceedings. IEEE, Sep. 2012, 6 pages.

Maciej Lipiński et al. "Reliability in A White Rabbit Network." Conf. Proc.. vol. 111010. No. CERN-ATS-2011-195., 13th International Conference on Accelerator and Large Experimental Physics Control Systems, Oct. 2011, 4 pages.

J. Serrano et al., "The White Rabbit Project", Proceedings of IBIC2013, Sep. 2013, 7 pages.

J. Serrano et al., "White Rabbit Status and Prospects", No. CERN-ACC-2013-0231, Oct. 2013, 4 pages.

M. Brückner et al., "A White Rabbit setup for sub-nsec synchronization, timestamping and time calibration in large scale astroparticle physics experiments", ICRC, vol. 33, Jul. 2013, 4 pages.

J. Serrano et al., "The White Rabbit Project", No. CERN-ATS-2009-096, Oct. 2009, 3 pages.

Pedro Moreira et al., "White Rabbit: Sub-Nanosecond Timing Distribution over Ethernet", 2009 International Symposium on Precision Clock Synchronization for Measurement, Control and Communication, IEEE, Oct. 2009, 5 pages.

M. Brückner, et al. "Results from the WhiteRabbit sub-nsec time synchronization setup at HiSCORE-Tunka." Proceedings of the 33rd International Cosmic Rays Conference, ICRC 2013, Jul. 2013, 4 pages.

Pietro Fezzardi et al., "PPSi—A Free Software PTP Implementation", 2014 IEEE International Symposium on Precision Clock Synchronization for Measurement, Control, and Communication (ISPCS), IEEE, 2014, 6 pages.

Maciej Lipiński et al. "White rabbit: A Ptp application for robust sub-nanosecond synchronization", 2011 IEEE International Symposium on Precision Clock Synchronization for Measurement, Control and Communication, IEEE, Sep. 2011, 6 pages.

M. Lipiński et al., "White Rabbit Applications and Enhancements", Precision Clock Synchronization for Measurement, Control, and Communication (ISPCS), 2018 IEEE International Symposium Proceedings 978-1-5386-4262-7, Oct. 3-5, 2018, 8 pages.

Opher Ronen, "Enhanced synchronization accuracy in IEEE1588," 2015 IEEE International Symposium on Precision Clock Synchronization for Measurement, Control, and Communication (ISPCS), IEEE, Oct. 2015, 7 pages.

V. Di Capua et al., "Real-Time Magnetic Measurement Monitoring under cRIO-LabVIEW Based Platform", ISPCS, Sep. 2018, 5 pages.

Mattia Rizzi et al., "White Rabbit clock characteristics", 2016 IEEE International Symposium on Precision Clock Synchronization for Measurement, Control, and Communication (ISPCS), IEEE, Sep. 2016, 6 pages.

Grzegorz Daniluk et al., "White Rabbit: Sub-Nanosecond Synchronization for Embedded Systems", Proceedings of the 43rd Annual Precise Time and Time Interval Systems and Applications Meeting, Nov. 2011, 15 pages.

Javier Serrano, "Small or medium-scale focused research project (STREP) proposal ICT Call 5", FP7-ICT-2009-5, Strep proposal White Rabbit, Oct. 23, 2009, V. 1, 80 pages.

IEEE, "IEEE Standard for a Precision Clock Synchronization Protocol for Networked Measurement and Control Systems", IEEE Std 1588™—2008, Jul. 24, 2008, 289 pages.

Cota, Emilio G. et al., "White Rabbit Specification: Draft for Comments", Version 2.0, Jul. 2011, 69 pages.

Daniluk, Grzegorz, "White Rabbit calibration procedure", Version 1.1, Nov. 9, 2015, 32 pages.

Jansweijer, P.P.M. et al., "Measuring propagation delay over a 1.25 Gbps bidirectional data link", National Institute tor Subatomic Physics, The Netherlands, May 31, 2010, 24 pages.

Moreira, Pedro et al., "Digital Dual Mixer Time Difference for Sub-Nanosecond Time Synchronization in Ethernet", Frequency Control Symposium, Jun. 2010, 5 pages.

Wlostowski, Tomasz et al., "Precise time and frequency transfer in a White Rabbit network", Apr. 2011, 98 pages.

Eidson, John C., "Measurement, Control, and Communication Using IEEE 1588," Chapters 3, 4, 5 & 8), ISBN 978-1-84628-251-5, Mar. 9, 2006, 161 pages.

Holmeide, Øyvind et al., "Synchronised Switching", IET Computing & Control Engineering, Apr./May 2006, 7 pages.

Lee, Kang et al., "Workshop on IEEE-1588, Standard for a Precision Clock Synchronization Protocol for Networked Measurement and Control Systems", Sep. 24, 2003, 154 pages.

International Search Report and Written Opinion in counterpart International Application No. PCT/IB2020/055732, dated Sep. 23, 2020, 16 pages.

Examination Report in counterpart Indian Application No. 202047033880, dated Jun. 30, 2022, 5 pages.

* cited by examiner

METHOD AND APPARATUS FOR HIGH PRECISION TIME STAMPING

TECHNICAL FIELD

This disclosure relates to time stamping of events and communication signals in computing systems.

BACKGROUND ART

In computing systems, it is often desirable to record the time at which an event occurred. This is referred to as "time stamping" the event. In the context of communications systems, one of the events desirable to time stamp is the transmission time or reception time of a message. For example, when analysing and debugging a communications system, knowing when messages were transmitted or received is just as important as seeing the content of the data.

Time stamping is particularly important for financial data processing systems, where regulations require detailed audit trails, including the precise times when messages were transmitted and received. Computer systems requiring time stamping will typically include hardware to provide a periodic pulse, also known as a clock, used for time stamping.

Some communications devices, including some computer network cards and network switches, include hardware functionality that can perform this time stamping, either on receive or transmit or both. In a typical implementation, the hardware contains a counter known as the time stamp counter. This counter may be any size but is typically 32 bits or 64 bits. The counter receives a reference clock from a crystal oscillator or from a phase-locked loop (PLL). Upon each cycle of the reference clock, the counter is incremented.

When a message is received (or transmitted, in the case of transmit time stamping), the current value of the time stamp counter is recorded together with the message. The resolution of these time stamps, therefore, is limited to the rate at which the counter is incremented. For example, if the counter is incremented at 200 megahertz, then the time stamps are provided with at best 5 ns resolution. With technology improvements and increasing execution speed for some systems, such timestamp periods may be too long to provide desired timestamp accuracy.

For example, a signal or transaction may be executed within a time period less than the counter increment period in some systems. Increasing the counter frequency helps improve the time stamp resolution but, depending on silicon technology, it may be impractical to increase the counter rate to the time stamp resolution that is desired.

One solution to improve the precision of the time stamping is to determine the phase difference between two clock signals, and then adjust the time stamp output by the time stamping unit to account for the latency created by the phase difference. This can be implemented in various manners, such as by the use of an XOR gate as a phase detector.

It is to be understood that, if any prior art is referred to herein, such reference does not constitute an admission that the prior art forms a part of the common general knowledge in the art, in Australia or any other country.

SUMMARY

Aspects of the invention are set out in the independent claims and preferred features are set out in the dependent claims. Features of one aspect may be applied to each aspect alone or in combination with other aspects.

In a first aspect, the present invention provides a method of determining time in a digital processing system. The method comprises, in a present cycle of a first digital clock:

accessing a reference time counter for a reference digital clock, wherein the reference time counter increments in value by a fixed amount at every cycle of the reference digital clock, the reference digital clock being of a higher accuracy than the first digital clock;

accessing a first time counter for the first digital clock, wherein the first time counter increments in value by an updatable increment amount at each cycle of the first digital clock;

comparing at least one part of the reference time counter with at least one corresponding part of the first time counter;

if there is a discrepancy between the at least one part of the reference time counter and the at least one corresponding part of the first time counter, adjusting one or more attributes of the first time counter, so that first time counter at least approximates the reference time counter. The time at the present cycle of the first digital clock is calculated on the basis of the first time counter.

In an embodiment, the first time counter is adjusted so that it tends toward the reference time counter.

The at least one part of the reference time counter can be one digital bit in the reference time counter, and the at least one corresponding part of the first time counter is a corresponding digital bit in the first time counter.

The first time counter can comprise an integral component and a fractional component.

The at least one corresponding part of the first time counter can be in the integral component of the first time counter.

The one or more attributes can comprise a present value of the first time counter.

The present value of the first time counter can be adjusted by being set to a present value of the reference time counter.

The present value of the first time counter can be adjusted by adding thereto or subtracting therefrom a predetermined value.

The method can further comprise: comparing the present value associated with the reference time counter, with a previous value which is associated with the reference time counter and obtained in a previous cycle of the first time counter. If the present and previous values of the reference time counter are equal, the present value of the first time counter can be decreased by the predetermined value. If the present and previous values of the reference time counter are not equal, the present value of the first time counter can be increased by the predetermined value.

It can be the fractional component of the present value of the first time counter which is increased or decreased.

The one or more attributes can comprise the variable increment amount by which the first time counter increments in value at each cycle of the first digital clock.

Adjusting the one or more attributes of the first time counter can comprise updating the variable increment amount, to be added to the second time counter at a future cycle of the first digital clock.

The updated increment amount can be calculated by determining an average number of reference digital clock cycles elapsed per first digital cycle, over a measurement period.

The updated increment amount can be determined by a circuit component.

The circuit component can be a digital loop filter block.

The first and reference counters can be compared at each cycle of the first digital clock.

In a second aspect, the present invention provides a method of determining a time stamp for an event in a digital processing system, the method comprising determining a time using the method mentioned in the first aspect above, at the cycle of the first digital clock during which the event is detected.

The method can further comprise: obtaining timing correction data from one or more hardware components of the digital processing system; and adjusting the present value of the first time counter based on the timing correction data to provide a precision time stamp value.

In a third aspect, the present invention provides a controller which implements the method mentioned in any of the paragraphs above.

In a fourth aspect, the present invention provides an apparatus for determining time for an event in a digital processing system, comprising the controller mentioned above.

In a fifth aspect, the present invention provides an apparatus for determining time for an event in a digital processing system, comprising: a first time counter associated with a first digital clock, wherein a value of the first time counter increments by a variable amount per cycle of the first digital clock; a second time counter associated with a second digital clock, wherein a value of the second time counter increments by a fixed increment amount per cycle of the second digital clock; wherein the second digital is more accurate than the first digital clock.

The apparatus can comprise a controller which controls a value of the first time counter at each cycle of the first digital clock, so that the value of the first time counter at least approximates a value of the second time counter obtained in the same cycle of the first digital clock.

The controller can determine the increment amount for the first time counter, so that the first time counter tends to increment at the same rate as the second time counter.

The controller can be adapted to determine whether the first and second time counters have different values.

The controller can be adapted to determine whether the first and second time counters have different values at each cycle of the first digital clock.

The controller can be adapted to sample one bit of the second time counter.

The controller can be adapted to compare the sampled bit of the second time counter with a corresponding bit of the first time counter.

The corresponding bit can be in an integral component of the first time counter.

The first time counter can be set to have the same value as the second time counter, when the controller determines that the first and second time counters have different values.

The value of first time counter can be increased or decreased by a pre-determined amount when the controller determines that the first and second time counters have different values.

The controller can be adapted to determine whether a present value of the second time counter obtained at a present cycle of the first digital clock differs from a previous value of the second time counter obtained at a previous cycle of the first digital clock.

The variable increment amount can be updated when the controller determines that the present and previous values of the second time counter differ.

The variable increment amount can be calculated over a measurement period and applied to the second time counter until it is again calculated over another measurement period.

The measurement period can occur regularly, irregularly, or at initiation by a user or an administrator.

The variable increment amount can be updated by increasing or decreasing it by a predetermined value.

The apparatus can further comprise a circuit component which determines the updated increment amount and updates the increment amount.

The circuit component can be a digital loop filter.

The circuit component can be part of the controller.

The apparatus can further comprise a time adjustment component configured to receive timing correction data from one or more hardware components of the digital processing system and adjust the first time counter based on the timing correction data, to provide a precision time stamp value.

In a further aspect, the present invention provides a method for obtaining high precision time information, comprising: obtaining or accessing a first time counter for a first digital clock which is incremented by a variable increment amount at each cycle of the first digital clock; obtaining or accessing a second time counter for a second digital clock which is incremented by a fixed amount at each cycle of the second digital clock, the second digital clock being of a higher accuracy than the first digital clock; wherein the first time counter is adjusted so that it at least tends towards the second time counter.

BRIEF DESCRIPTION OF THE DRAWINGS

Embodiments will now be described by way of example only, with reference to the accompanying drawings in which.

DETAILED DESCRIPTION

Figure 1:
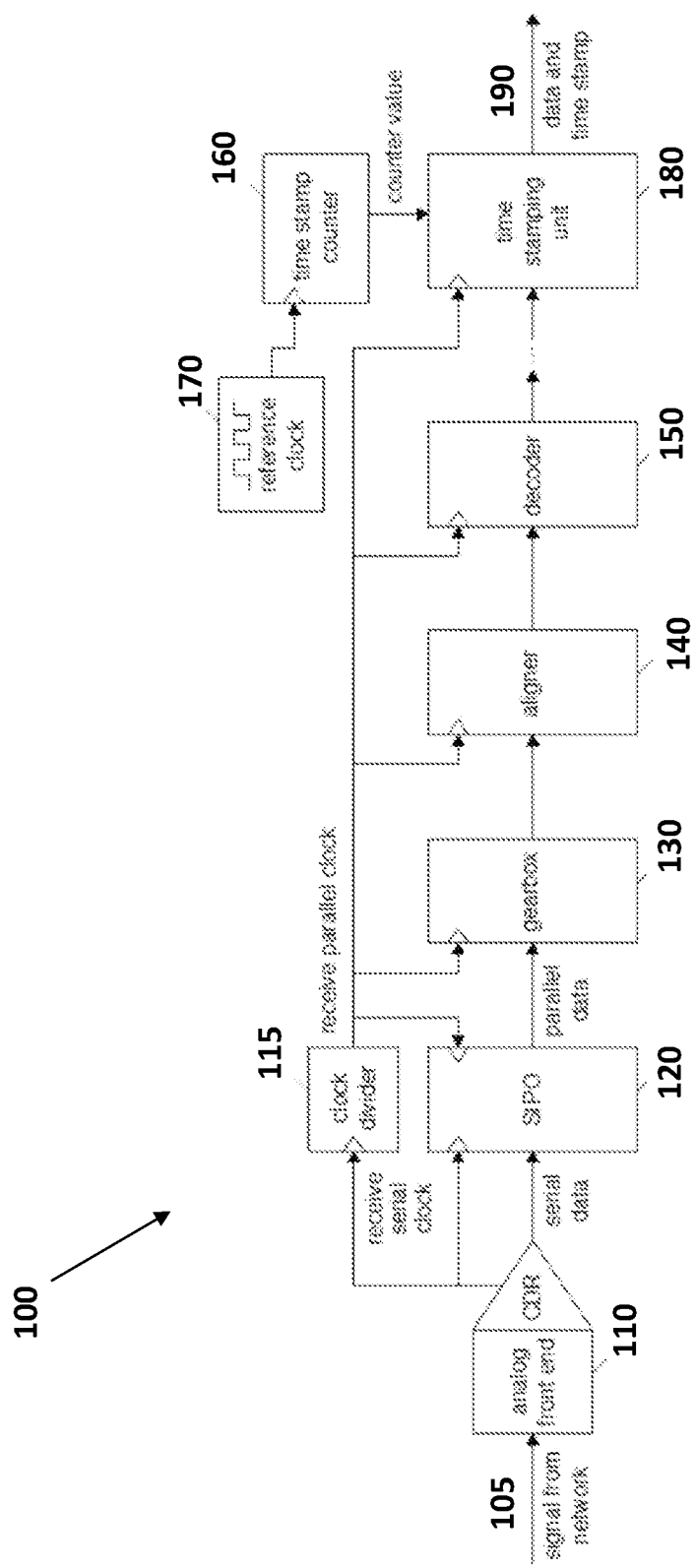
FIG. 1 is a block diagram showing typical (prior art) components of a network receiver for a communication network.

In the following detailed description, reference is made to accompanying drawings which form a part of the detailed description. The illustrative embodiments described in the detailed description, depicted in the drawings and defined in the claims, are not intended to be limiting. Other embodiments may be utilised and other changes may be made without departing from the spirit or scope of the subject matter presented. It will be readily understood that the aspects of the present disclosure, as generally described herein and illustrated in the drawings can be arranged, substituted, combined, separated and designed in a wide variety of different configurations, all of which are contemplated in this disclosure.

In the following, there is disclosed a novel method and system for high precision time-stamping.

In most cases, are two clock domains are involved in the receipt, subsequent decoding if necessary, and then the time-stamping of, a network event (such as an incoming message). These include the reference clock domain and the network clock domain. The reference clock domain is a highly stable clock, typically from a temperature-controlled oscillator (OCXO) or atomic clock, that can be assumed to be the absolute source of time. The network clock is a lower quality clock that has been recovered from the data incoming from the network.

When the reference clock and network clock run at a similar frequency, the precise time of a network event (such as a received bit of information) can be calculated by first determining the offset of the event from the network clock edge, and then determining the offset of the network clock edge from the reference clock edge. Embodiments of this approach are described in the Applicant's application PCT/AU2017/051120, the contents of which are incorporated herein.

However, in many cases the reference clock is a very different frequency: to provide a common example, we will consider a reference frequency of 10.000000 Mhz and a network clock frequency of approximately 161.1328125 Mhz (10 Gigabit Ethernet rate divided by 64 bits per cycle). One approach would be to multiply the reference clock to the desired frequency using a Phase Locked Loop. A downside of this approach is that the PLL uses additional power and area.

FIG. 1 depicts the architecture of a prior art network receiver 100. The receiver architecture 100 includes analogue front end components for signal reception 110 and digital components can include a serial in parallel out (SIPO) component (or a "deserialiser") 120, a gearbox 130, an aligner 140, a decoder 150, and time stamping unit 180.

The SIPO component 120 converts the high-speed serial data to a parallel bus at a lower frequency that can be more readily processed. The gearbox 130, if included, converts the data width to a more natural size for the protocol. The receiver serial clock is divided by clock divider 115 and the receiver parallel clock signal is used to synchronise the digital receiver components. An additional reference clock 170 may be used by the time stamp counter 160 to input to the time stamp unit 180 which applies the time and data stamp to the signal data 190 passed on to the downstream processing system.

Previous approaches for improving the type of architecture shown in FIG. 1 generally involves the use of a time adjustment component, which is used to modify the "coarse" time stamp to produce a precision time stamp. The precision time stamp is then passed along with the network event data to the downstream system.

Figure 2:
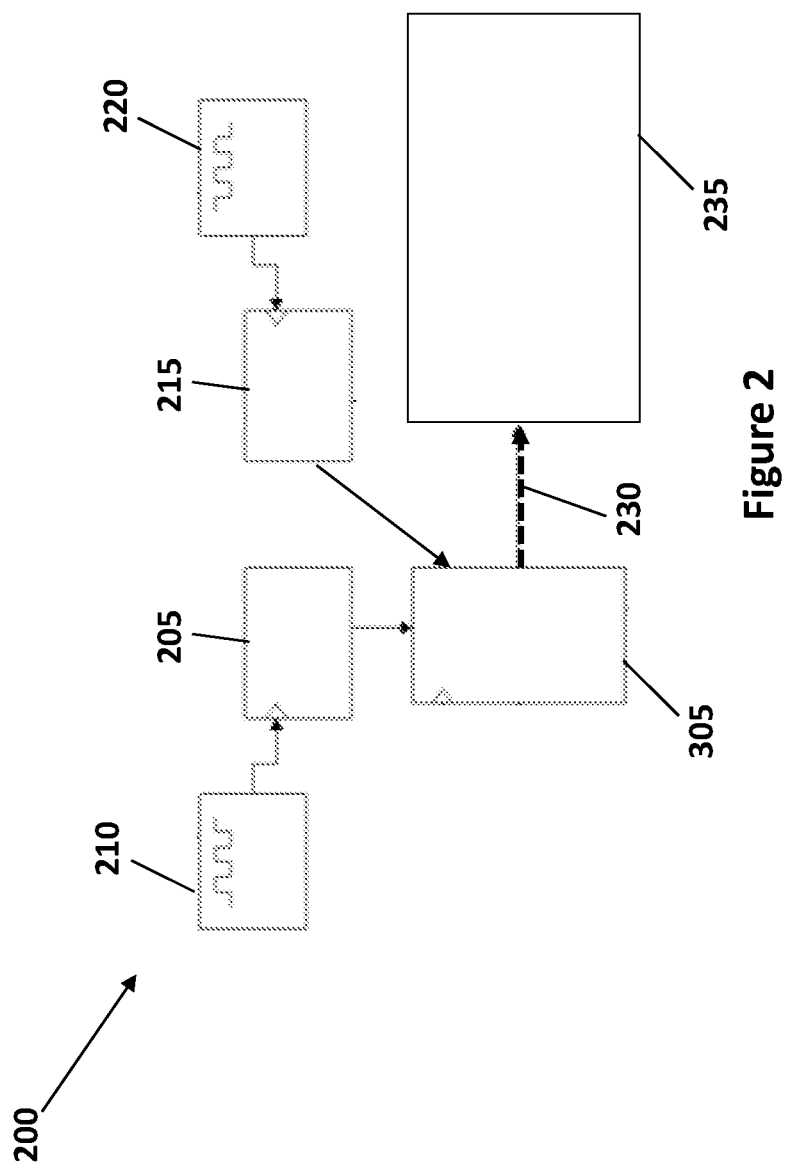
FIG. 2 is a portion of a modified network architecture in accordance with an embodiment of the present invention, including a controller which receives time signal from a network domain clock and a reference domain clock.

The present invention uses a different approach. As shown in FIG. 2, the receiver has a modified architecture 200 (partially shown in FIG. 2) which includes one time counter 205 time which receives input from a reference clock 210, and is thus also referred to as the "reference time counter" 205. The receiver architecture 200 further includes another time stamp counter which is kept in the network clock domain, and thus the other time counter 215 is also referred to as the "network time counter" 215.

The network clock domain receives information from a network clock 220, which can run at a much higher frequency than the reference clock 210, but is of a lower accuracy compared to the reference clock 210. That is, the time information provided reference clock 210 is closer to or is considered the "ground truth" time, where as the time provided by the network domain clock 220 is less precise.

The reference time counter 205 is incremented by a fixed amount (e.g. 1), whereas the network time counter 215 is incremented by a variable amount "delta" (Δ), where Δ is influenced by the more accurate reference clock 210, so as to synchronise the network time counter 215 with the reference time counter 205.

A controller 305 takes the input from the network time counter 215, which has a better granularity because of the higher frequency of the network clock 220, but as mentioned above, at the same time the network time counter 215 is adjusted so that it can match or synchronise with, as much as possible, the "ground truth" time provided by the reference clock 210. This is done by adjusting one or more attributes of the network time counter 215. The controller 305 provides the synchronised network domain time counter 215 to the time stamp unit 225, to produce an adjusted timestamp 230, which is then provided with the event data tor downstream processes 235. The controller 305 can be hardware implemented. For instance it can be a circuit, which may comprise logic gates (e.g., field programmable gate array).

The synchronisation between the network time counter 215 and the reference time counter 205 comprises two aspects. First, the amount by which the network time counter 215 increments (with each network clock cycle), i.e., A, is adjusted so that the network time counter 215 is incremented at the same rate as the reference time counter. Second, the actual value of the network time counter 215 is adjusted so that there is not an offset between the network time counter 215 and the reference time counter 205, when the network time counter 215 is incremented at the correct rate. Depending on the embodiment, either or both of these aspects are included in the control for the network time counter 215.

Figure 3:
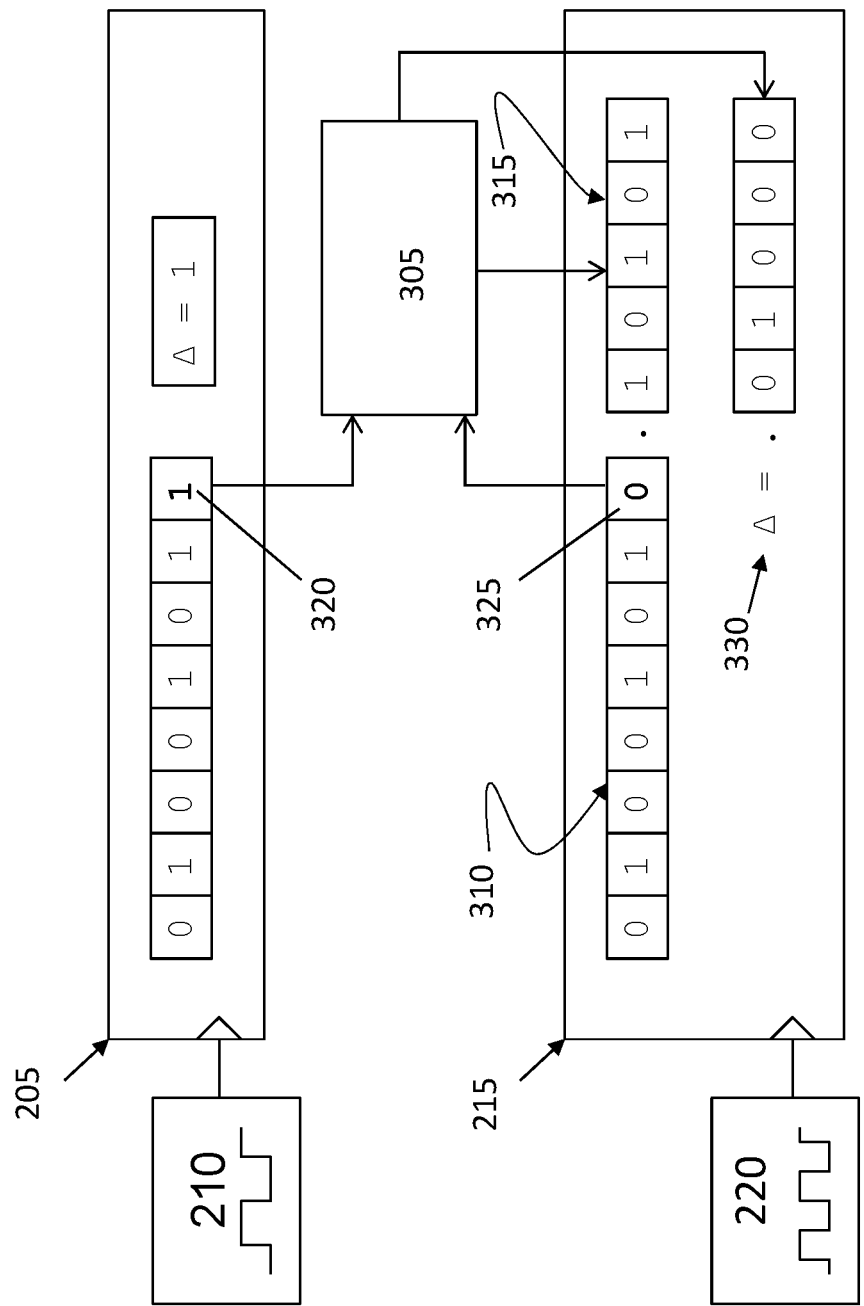
FIG. 3 schematically depicts a control architecture for the network time counter.

Referring to FIG. 3, the network architecture includes a controller 305 to control the network time counter 215 and the reference time counter 205, provided by a controller 305. The controller 305 can be implemented as a separate module, or as a part of the time stamp unit. The network time counter 215 includes a first or "integral" component 310, and a second or "fractional" component 315. The network time counter 215 counts by a programmable fractional increment (A) per cycle.

The controller 305 operates in the network clock domain, with the aim to synchronise the integral portion 310 of the network time counter 215 with the reference time counter, and the aim that the increment approximates the period of the network clock (as a fraction of the reference clock).

To adjust the increment amount 4, and hence the rate by which the network time counter 215 is incremented, the controller 305 can include steps to adjust the value of increment amount at each network clock cycle. The controller 305 can also or instead include steps to, over a period of time (or over a predetermined number of network clock cycles), directly measure the increment amount 4 that is to be added to the network time counter 215 at each network clock cycle.

To correct for the offset between the value of the network time counter 215 and that of the reference time counter 205, the controller 305 can also adjust the actual network time counter 215 value. The controller 305 can, additionally or alternatively, force or set the network time counter 215 to have the same value as the reference time counter 205.

Specifically, the controller 305 operates by sampling one bit 320 of the reference time counter 205. This bit will be compared with the corresponding bit 325 in the integral component 310 of the network time counter 215. Thus the integral component 310 of the network time counter 215 and the reference time counter 205 have the same number of bits. In an embodiment, the bottom bit of the reference time counter 205 is sampled, but another bit can be chosen in another embodiment. Because the reference clock edge (rising or falling, depending on the embodiment) and also the network clock edge take time to propagate through a circuit, the phase offset will be different at different points in the circuit. By using only a single bit, this provides a single point at which the phase offset is measured, thus avoiding this problem. Using a single bit also avoids synchronization problems that arise when transferring bits between clock domains.

The sampled bit 320 of the reference time counter 205 is compared with the corresponding bit 325 of the network time counter 215. This comparison is performed by the controller 305, to determine if the two bits 320, 325 have the same value or different values, and accordingly adjust the increment amount ($\Delta$) 330 by which to change the network time counter 215 (and hence the network domain time stamp). $\Delta$ will initially be a pre-programmed value, and will be adjusted from the pre-programmed value.

In some embodiments, the controller 305 adds the existing (i.e. present) value of the increment amount $\Delta$ to the network time counter 215. The updated value for $\Delta$ will be added to the network time counter 215 at the next network clock cycle. In other embodiments, the controller 305 determines the updated value for the increment amount 330 (which will either be the same as the present value or adjusted from the present value), and then adds the updated value to the network time counter 215.

Figure 4:
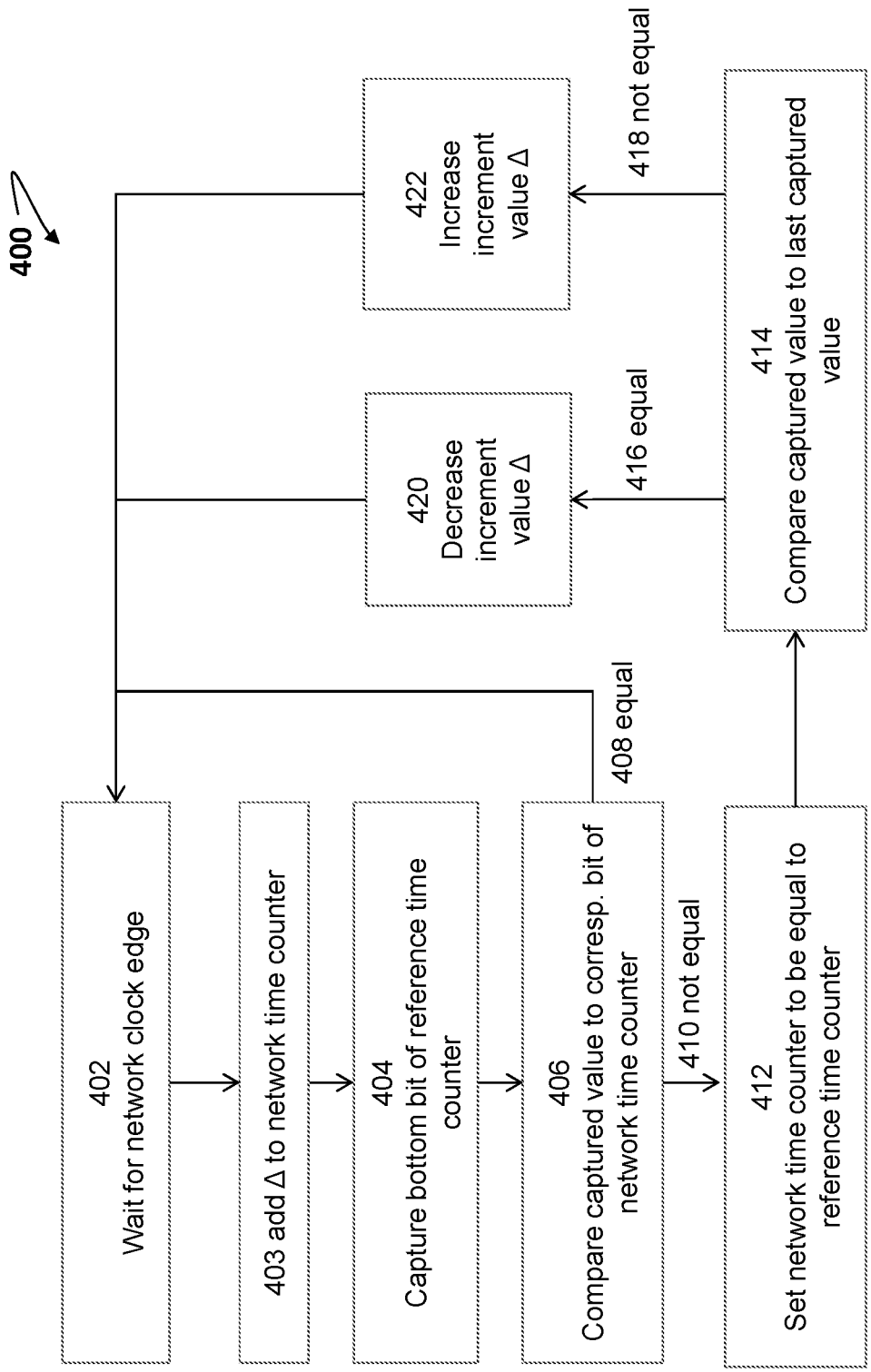
FIG. 4 schematically depicts a control loop for determining the network time counter, in accordance with one embodiment of the present invention.

In one embodiment, the determination of how the network time counter 215 is adjusted, is made in the control loop 400 depicted in FIG. 4. The controller 305 is adapted to detect the next network clock cycle, by detecting a rising edge in the network clock 220. Upon the controller 305 detecting a rising edge in the network clock 220 cycle (step 402), the controller 305 adds the present value of the increment amount $\Delta$ to the network time counter 215 (step 403). The controller 305 also captures the value of a single bit 320 in the reference clock domain counter 205 (step 404). The controller 305 compares this value with a value of the corresponding bit 325 in the integral portion 310 of the network time counter 215 (step 406). If the values are equal (i.e. both are "0" or both are "1" in binary systems), the controller 305 does not further update the network time counter 215 or the increment amount $\Delta$ (and hence the network domain time stamp), and keeps waiting for the next rising edge in the network clock (arrow 408). If the values are not equal (arrow 410), the controller 305 updates the integral component 310 of the network time counter 215 by setting the value of this component equal to the value of the reference domain time counter 205 (step 412).

Next, the controller 305 compares the value of the sampled bit 320 in the reference time counter 205, with the previous value of the same bit, i.e., the value of the same bit obtained at the previous network clock rising edge (step 414). In the case that the bottom bit (i.e. trailing bit) of the reference time counter 205 is sampled, equal (that is, unchanged) values of the bottom bit would indicate that the reference domain clock 210 is still in the same cycle even though the network domain clock 220 has progressed to the next cycle. Therefore, if the sampled bit of the reference time counter 205 has not changed value (arrow 416), the controller 305 will decrease the increment amount for the fractional component 315 of the network time counter 215 (i.e. $\Delta$ is decreased).

Conversely, unequal values (that is, changed value) of the bottom bit of indicate that the reference domain clock 210 has also progressed to the next cycle. Therefore, if the sampled bit of the reference time counter 205 has changed in value since the previous rising edge of the network clock (arrow 418), the controller 305 will increase the amount by which the value of the fractional component 315 increments (i.e. $\Delta$ is increased).

In the above, the amounts by which $\Delta$ is adjusted (i.e. increased or decreased) is, in a typical embodiment, the smallest possible digital value fraction for the fractional component 315 of the network time counter 215. The exact value by which $\Delta$ is adjusted is not an essential requirement in the presently disclosed invention. The skilled addressee will be able to determine, e.g. by using control theory or by setting a small number (such as 0.001) and fine tuning therefrom, the desired amount by which $\Delta$ is to be adjusted.

Figure 5:
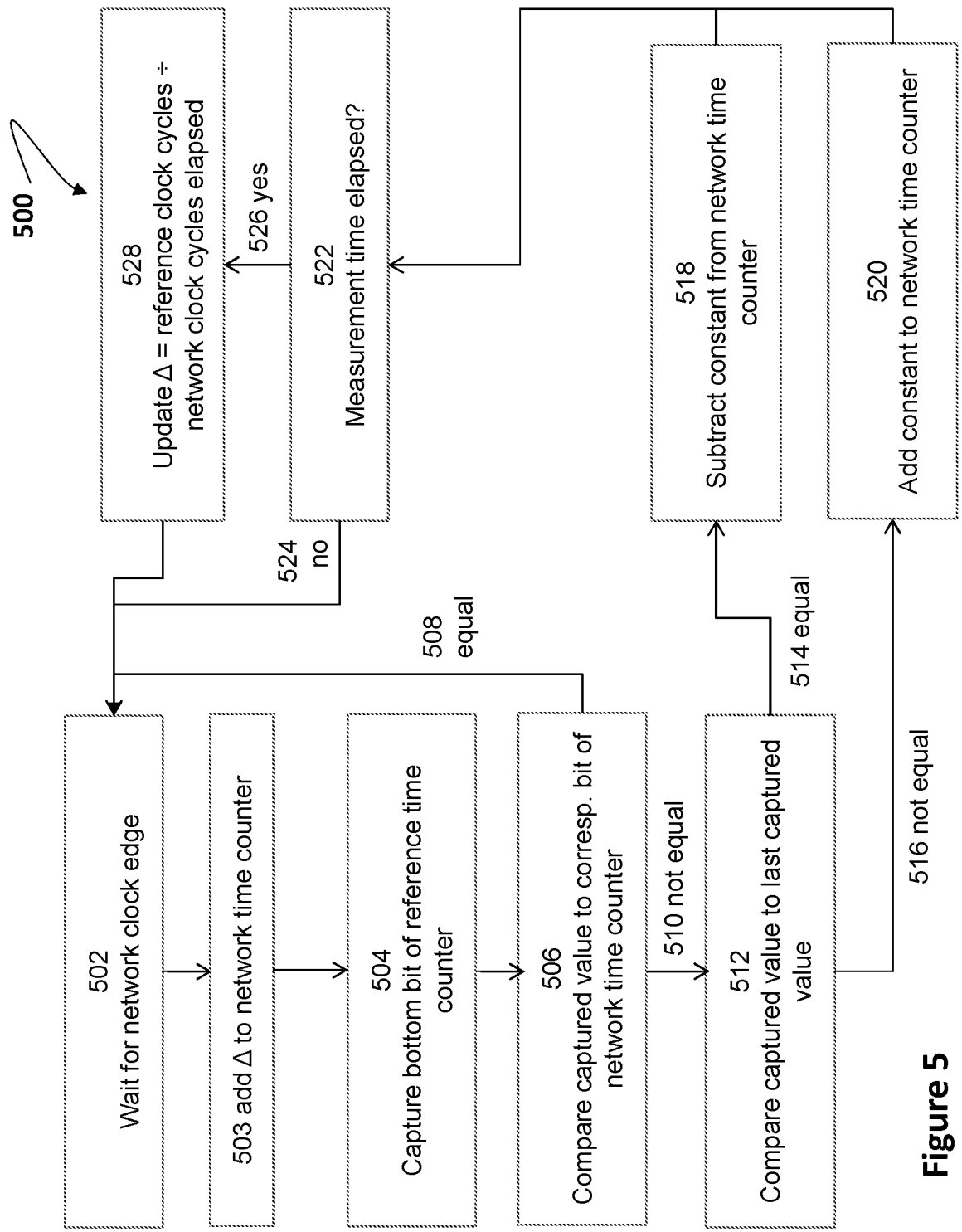
FIG. 5 schematically depicts a control loop for determining the network time counter, in accordance with another embodiment of the present invention.

In another embodiment, the network time counter 215 is determined in the control loop 500 depicted in FIG. 5. The controller 305 is adapted to detect the occurrence of a rising edge in the network clock 220. Upon detecting a rising edge in the network clock 220 cycle (step 502), the controller 305 adds the present value of the increment amount $\Delta$ to the network time counter 215 (step 503). The controller 305 also captures the value of a single bit 320 in the reference clock domain counter 205 (step 504). This value is compared with a value of the corresponding bit 325 in the integral portion 310 of the network time counter 215 (step 506). If the values are equal (i.e. both are "0" or both are "1" in binary systems), the controller 305 does not change the increment amount $\Delta$; that is, the updated value for $\Delta$ will be the same as the present value for $\Delta$. The controller 305 keeps awaiting for the next rising edge in the network clock (arrow 508), and will increment the network time counter 215 by the same A again at the next network clock cycle.

If the values of the corresponding bits are not equal (arrow 510), the controller 305 compares the current values of the particular bit with its previous value, i.e., the value of the same bit which is captured at the previous network clock rising edge (step 512), to see if this bit has changed in value. If the current and the previous values are equal (arrow 514), the controller 305 subtracts a constant from the value of the network domain time stamp (step 518). If the current and the previous values are not equal (arrow 516), the controller 305 adds a constant from the value of the network domain time stamp (step 520). The constant is a predetermined amount, usually a small fractional value.

Steps 518 and 520 directly adjusts an offset between the reference time counter 205 and the network time counter 215, as opposed to adjusting the rate at which the network time counter 215 is incremented. The controller 305 in some forms of the embodiment may further adjust the present value of the increment amount (A) itself to produce an updated value for the increment amount $\Delta$, so that at a later network clock cycle, the network time counter 215 is incremented by the updated value A.

In one example, the period of the network clock 220 is approximated by setting a measurement time period. The measurement time period is a fixed amount of time, or it is a fixed number of network clock cycles. The number of reference clock cycles in this measurement time period is counted, e.g., by reading the reference time counter at the beginning and again at end of that measurement time period, and taking the difference in the two readings. The number of reference clock cycles, divided by the number of network clock cycles during the measurement time period, is the updated value for the increment amount Δ.

Thus, to incorporate the above step of updating the value of the increment amount Δ, the controller 305 will regularly or as prompted by another network process, initiate a measurement period, and thereafter wait for the next rising edge of the network clock 210 (step 502) and then continue as described above in relation to steps 504, 506, and 512. After the network time counter 215 is adjusted by adding a constant (step 520) or by subtracting a constant (step 518), the controller 305 further checks whether the measurement period has ended (step 522). If the measurement period has not ended (arrow 524), the value of the increment value Δ is not updated, and the controller keeps waiting for the next network clock cycle (step 502). If on the other hand the measurement period has elapsed (arrow 526), the controller 305 determines the updated value for the increment amount Δ. The updated value is the number of reference clock cycles within the measurement period divided by the number of network clock cycles within the measurement period. The measurement period will then be reset. The next measurement period will follow immediately, after a predetermined amount of time or predetermined number of network clock cycles or reference clock cycles, or upon activation by the user or a network administrator.

Figure 6:
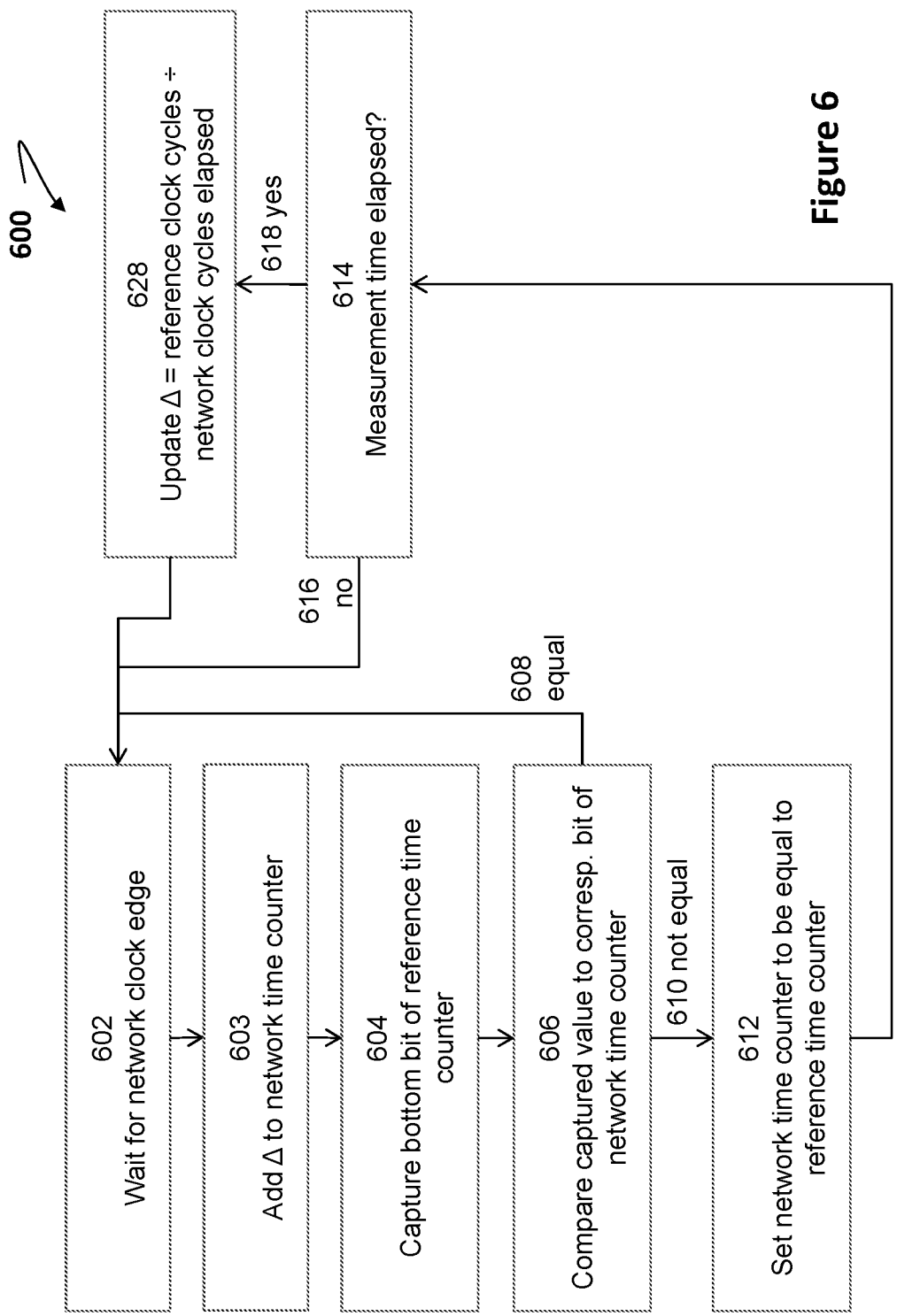
FIG. 6 schematically depicts a control loop for determining the network time counter, in accordance with a further embodiment of the present invention.

FIG. 6 depicts an alternative control loop 600 for determining the network time counter 215. This embodiment combines elements from the control loop 400 shown in FIG. 4 and the control loop 500 shown in FIG. 5. The controller 305 is adapted to detect the next network clock cycle, by detecting a rising edge in the network clock 220. Upon the controller 305 detecting a rising edge in the network clock 220 cycle (step 602), the controller 305 adds the present value of the increment amount Δ to the network time counter 215 (step 603). The controller 305 also captures the value of a single bit 320 in the reference time counter 205 (step 604). The controller 305 compares this value with a value of the corresponding bit 325 in the integral portion 310 of the network time counter 215 (step 606). If the values are equal, the controller 305 keeps waiting for the next rising edge in the network clock (arrow 608) and does not update the value of the increment amount Δ. If the values are not equal (arrow 610), the controller 305 updates the network time counter 215 by setting it to be the value of the reference time counter 205 (step 612).

From step 612, the controller 305 will check whether it should update the value of the increment amount Δ. It does so by first checking whether the measurement period mentioned above in respect of FIG. 5 has ended (step 614). If the measurement period has not ended (arrow 616), the value of the increment value Δ is not updated, and the controller 605 keeps waiting for the next network clock cycle (step 602). If on the other hand the measurement period has ended (arrow 618), the controller 305 determines the updated value for the increment amount Δ, as in the case for the control loop 500 shown in FIG. 5.

Figure 7:
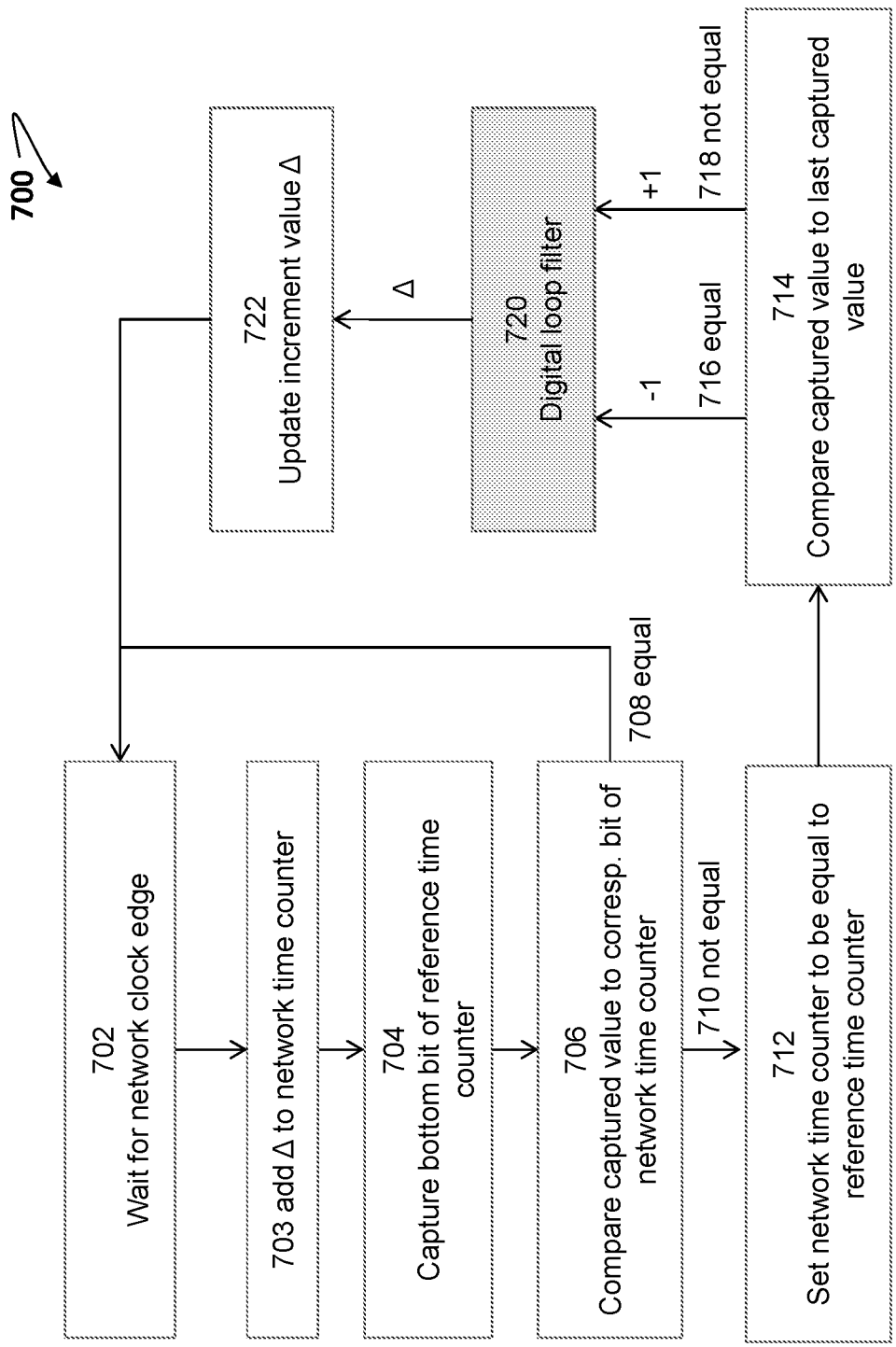
FIG. 7 schematically depicts a control loop for determining the network time counter, in accordance with a further embodiment of the present invention.

FIG. 7 depicts another control loop 700 for determining the network time counter 215. The controller 305 waits for the next network clock cycle by detecting a rising edge in the network clock signal (step 702). Once the next cycle is detected, the controller 305 adds the present value of the increment amount Δ to the network time counter 215 (step 703). The controller 305 also captures the value of a single bit 320 in the reference clock domain counter 205 (step 704). The controller 305 compares this value with a value of the corresponding bit 325 in the integral portion 310 of the network time counter 215 (step 706). In essence this allows the controller 305 to detect that there is a difference in the values of the reference time counter 205 and the integral portion 310. If these values are the same (arrow 708), the controller 305 does not further update any attribute of the network clock counter 215, and waits for the next network clock cycle (arrow 708). If the values differ (arrow 710), the controller 305 sets the integral portion 310 of the network time counter 215 to the value of the reference time counter 205 (step 712). In step 714 it then compares the current value of the sampled bit 320 with the previously captured value of the sampled bit (i.e. obtained at the previous network clock cycle) in the reference time counter 205. Up to this point the control loop 700 is the same as the control loop 400 shown in FIG. 4.

Unlike the embodiment shown in FIG. 4, once the present and previous values of the sampled bits are compared (step 714), the controller 305 inputs a variation information to a further circuit 720 which determines the updated increment amount Δ on the basis of the variation information received. The further circuit is a digital filter block 720, and the variation information inputted thereto depends on the result of the comparison between the present and the previous values of the sampled bit 320 in the reference time counter 205 (arrow 716 and arrow 718). In one embodiment, the variation information indicates the sign of change to be made to the increment amount Δ. For instance, the variation information indicate a "positive" or "negative" sign of a variation amount. If the present and previous values are the same, a negative variation information (−1) is inputted (arrow 716). If the present and previous values are not the same, a positive variation information (+1) is inputted (arrow 718). It will be appreciated that the digital loop filter block 720 may perform processing of a higher complexity to produce an update value for Δ than simply increasing or decreasing its value by a particular amount. The digital loop filter block 720 produces a change value or an updated value for Δ, and then updates the increment amount Δ accordingly (step 722). The controller 305 again awaits for the next network clock cycle (step 702). The updated increment amount Δ will be used to increment the network time counter at the next network clock cycle (step 703).

In FIG. 7, the box labelled 720 is shaded to differentiate it as a reference to a component rather than a method step. In one embodiment, the digital loop filter block 720 is a digital loop filter circuit, such as one that may be found in a conventional Digital Phase Locked Loop circuit. A person skilled in the art will be able to determine the parameters for this loop filter such that the output Δ converges towards the period of the network clock (as a fraction of the reference clock). The digital loop filter block 720 can be included as part of the controller 305 or can be separate to the controller 305.

In the above embodiments, the network time counter 215 is progressing at a high frequency, in the sense that its value is being determined at a frequency that is determined by the high frequency of the network domain clock 210. However, each time this determination is made, it is made with reference to the more accurate network domain clock 220.

In the embodiments shown in FIGS. 4 and 6, every time the integral component 310 of the network time counter 215 is detected to be out of sync with the reference time counter 205, the controller sets the network time counter 215 equal to the reference time counter 205. The controller 305 then updates the increment amount Δ to be added to the network time counter 215 at the next network clock cycle, in a different manner in each of FIGS. 4 and 6.

In the embodiment shown in FIG. 5, every time the integral component 310 of the network time counter 215 is detected to be out of sync with the reference time counter 205, the controller directly adjusts the fractional component 315 of the network time counter 215, and may then further determines an updated increment value Δ. The updated value in essence is the average number of elapsed reference clock cycles per elapsed network clock cycle.

Generally, the embodiments shown in FIG. 5 will be more preferable over that shown in FIGS. 4 and 6, because the controller 305 is frequently adjusting the fractional component 315 of the network time counter 215 to be in step with the reference time counter 205. Therefore, the adjustments made to the network time counter 215 are smaller and thus smoother, compared to the larger adjustments to force the network time counter 215 to be the same as the reference time counter 205. Similarly, the embodiment shown in FIG. 4 are preferable over that shown in FIG. 6, as the value of the increment amount is updated more frequently, i.e., at every network clock cycle, than only once per measurement period.

The value of the network time counter 215, as determined in one of the embodiments described above, will thus be synchronised with the reference time counter in one or more aspects as described. The time stamp can then be determined using the more accurate time information from the reference clock.

Thus, when a network event is detected to occur, the event time can be more accurately determined. The event time can be even more accurately determined, by, e.g. taking into account the offset of the detected event from the network clock edge, or the delay times which arise in the digital processes in the network architecture, to further adjust the event time. These further adjustments specific to the event and the delay in processing the event data are described in the herein incorporated application, PCT/AU2017/051120.

Variations and modifications may be made to the parts previously described without departing from the spirit or ambit of the disclosure.

For example, the controller 305 can compare the two time counters 205, 215 at each falling edge of the network clock 210 and make the adjustments to the increment value Δ or the network domain counter's fractional component 315, rather than at every rising edge.

In the embodiments shown in FIGS. 3 to 5, the controller 305 adds the present value of the increment amount Δ to the network time counter 215 when it detects a rising edge (or when it detects a falling edge in another embodiment). However, in alternative embodiments, the controller 305 can first determine the updated value of the increment amount Δ, and then add the updated value to the network time counter 215.

As another example, the controller 305 can be provided as part of the network side time stamp unit, or it can be provided in a module which is separate to the network side time stamp unit.

While the control paradigm 400, 500 can be considered a control "loop" which occurs at each rising (or falling) network clock edge, the controller 305 is not necessarily implemented as a loop. The circuit implementation can be determined by the person skilled in the art.

In FIGS. 4 to 7, the comparison between the reference time counter 205 and the integral portion 310 of the network time counter 215 is made on the basis of corresponding single bits. The result of the comparison is that the controller 305 can detect when there is a difference between the reference time counter 205 and the integral portion 310 of the network time counter 215. Thus, a different number of bits, or the entire values of the reference time counter 205 and the integral portion 310 of the network time counter 215, may alternative be used for comparison.

The novel method disclosed herein may use less area or power and/or provide better time stamping precision in some cases, particularly when the reference clock frequency is unrelated to the network clock domain.

In summary, disclosed is a method of determining time in a digital processing system, comprising, in a present cycle of a first digital clock: accessing a reference time counter for a reference digital clock, wherein the reference time counter increments in value by a fixed amount at every cycle of the reference digital clock, the reference digital clock being of a higher accuracy than the first digital clock; accessing a first time counter for the first digital clock, wherein the first time counter increments in value by an updatable increment amount at each cycle of the first digital clock; and comparing at least one part of the reference time counter with a at least one corresponding part of the first time counter. If there is a discrepancy between the at least one part of the reference time counter and the at least one corresponding part of the first time counter, the method comprises adjusting one or more attributes of the first time counter, so that first time counter at least approximates the reference time counter. A time at the present cycle of the first digital clock is calculated from the first time counter.

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

The invention claimed is:

1. A method of determining time in a digital processing system, comprising, in a present cycle of a first digital clock:
   accessing a reference time counter for a reference digital clock, wherein the reference time counter increments in value by a fixed amount at every cycle of the reference digital clock, the reference digital clock being of a higher accuracy than the first digital clock;
   accessing a first time counter for the first digital clock, wherein the first time counter increments in value by a variable increment amount at each cycle of the first digital clock;
   comparing at least one part of the reference time counter with at least one corresponding part of the first time counter obtained in a present cycle of the first digital clock; and
   in response to determining that there is a discrepancy between the at least one part of the reference time counter and the at least one corresponding part of the first time counter based on the comparing:
      adjusting a present value of the first time counter to provide an updated value, so that the updated value of the first time counter at least approximates a present value of the reference time counter; and
      updating the variable increment amount to provide an updated increment amount, to be added to the first time counter at a future cycle of the first digital clock, so that the first time counter tends to increment at a same rate as the reference time counter;

wherein a time at the present cycle of the first digital clock is calculated from the first time counter.

2. The method of claim 1, wherein the at least one part of the reference time counter is one digital bit in the reference time counter, and the at least one corresponding part of the first time counter is a corresponding digital bit in the first time counter.

3. The method of claim 1, wherein the first time counter comprises an integral component and a fractional component.

4. The method of claim 3, wherein the at least one corresponding part of the first time counter is in the integral component of the first time counter.

5. The method of claim 1, wherein adjusting the present value of the first time counter comprises:
setting the present value of the first time counter to be equal to the present value of the reference time counter.

6. The method of claim 1, wherein adjusting the present value of the first time counter comprises:
subtracting a predetermined value from the present value of the first time counter; or
adding the predetermined value to the present value of the first time counter.

7. The method of claim 6, further comprising:
comparing the present value associated with the reference time counter with a previous value which is associated with the reference time counter and obtained in a previous cycle of the first digital clock,
wherein:
if the present and previous values of the reference time counter are equal, the present value of the first time counter is decreased by the predetermined value; and
if the present and previous values of the reference time counter are not equal, the present value of the first time counter is increased by the predetermined value.

8. The method of claim 1, wherein the updated increment amount is calculated by determining an average number of reference digital clock cycles elapsed per first digital clock cycle, over a measurement period.

9. The method of claim 1, wherein the first time counter and the reference time counter are compared at each cycle of the first digital clock.

10. The method of claim 1, further comprising:
determining a time stamp for an event in a digital processing system using a time, at a cycle of the first digital clock during which the event is detected.

11. The method of claim 10, further comprising:
obtaining timing correction data from one or more hardware components of the digital processing system; and
adjusting the present value of the first time counter based on the timing correction data to provide a precision time stamp value.

12. An apparatus for determining time for an event in a digital processing system, comprising:
a first time counter associated with a first digital clock, wherein a value of the first time counter increments by a variable increment amount per cycle of the first digital clock;
a second time counter associated with a second digital clock, wherein a value of the second time counter increments by a fixed increment amount per cycle of the second digital clock, wherein the second digital clock is more accurate than the first digital clock; and
a controller which controls a value of the first time counter at each cycle of the first digital clock, wherein the controller is configured to:
compare a present value of the second time counter with a present value of the first time counter obtained in a present cycle of the first digital clock; and
in response to determining that the present value of the first time counter and the present value of the second time counter are different:
adjust the present value of the first time counter to provide an adjusted value, so that the adjusted value of the first time counter at least approximates the present value of the second time counter; and
update the variable increment amount to provide an updated increment amount, to be added to the first time counter at a future cycle of the first digital clock, so that the first time counter tends to increment at a same rate as the second time counter.

13. The apparatus of claim 12, wherein the controller is configured to:
determine the updated increment amount for the first time counter, so that the first time counter tends to increment at the same rate as the second time counter.

14. The apparatus of claim 12, wherein the controller determines whether the first time counter and the second time counter have different values at each cycle of the first digital clock.

15. The apparatus of claim 12, wherein the controller samples one bit of the second time counter and compares a simple bit of the second time counter with a corresponding bit of the first time counter.

16. The apparatus of claim 12, wherein the controller adjusts the present value of the first time counter to provide the adjusted value by setting the first time counter to have a same value as the second time counter when the controller determines that the first time counter and the second time counter have different values.

17. The apparatus of claim 12, wherein the controller adjusts the present value of the first time counter to provide the adjusted value by increasing or decreasing the present value of first time counter by a predetermined value when the controller determines that the first time counter and the second time counter have different values.

18. The apparatus of claim 12, wherein the controller is configured to:
determine whether the present value of the second time counter obtained at the present cycle of the first digital clock differs from a previous value of the second time counter obtained at a previous cycle of the first digital clock.

19. The apparatus of claim 18, wherein the controller updates the variable increment amount to provide the updated increment amount when the controller determines that the present value and the previous value of the second time counter differ.

20. The apparatus of claim 19, wherein the variable increment amount is calculated over a measurement period and applied to the first time counter until the variable increment amount is again calculated over another measurement period.

21. The apparatus of claim 19, wherein the controller updates the variable increment amount to provide the updated increment amount by increasing or decreasing the variable increment amount by a predetermined value.

22. The apparatus of claim 19, further comprising:
a circuit component which determines the updated increment amount and updates the variable increment amount by the updated increment amount.

23. The apparatus of claim 12, further comprising:
a time adjustment component configured to:
receive timing correction data from one or more hardware components of the digital processing system; and
adjust the present value of the first time counter based on the timing correction data to provide a precision time stamp value.

24. A method for obtaining high precision time information, comprising:
obtaining or accessing a first time counter for a first digital clock which is incremented by a variable increment amount at each cycle of the first digital clock;
obtaining or accessing a second time counter for a second digital clock which is incremented by a fixed amount at each cycle of the second digital clock, the second digital clock being of a higher precision than the first digital clock;
comparing a present value of the second time counter with a present value of the first time counter obtained in a present cycle of the first digital clock; and
in response to determining that the first time counter and the second time counter have different values based on the comparing:
adjusting the present value of the first time counter to provide an adjusted value, so that the adjusted value of the first time counter at least tends towards the present value of the second time counter; and
updating the variable increment amount to provide an updated increment amount, to be added to the first time counter at a future cycle of the first digital clock, so that the first time counter tends to increment at a same rate as the second time counter.

25. The method of claim 24, wherein adjusting the present value of the first time counter to provide the adjusted value comprises:
setting the present value of the first time counter to be equal to the present value of the second time counter.

26. The method of claim 24, wherein adjusting the present value of the first time counter to provide the adjusted value comprises:
comparing the present value of the second time counter obtained in the present cycle of the first digital clock with a previous value of the second time counter obtained in a previous cycle of the first digital clock;
if the present value and the previous value of the second time counter are equal, subtracting a predetermined value from the present value of the first time counter to obtain the adjusted value of the first time counter; and
if the present value and the previous value of the second time counter are not equal, adding the predetermined value to the present value of the first time counter to obtain the adjusted value of the first time counter.

27. The method of claim 24, wherein updating the variable increment amount to provide the updated increment amount comprises:
comparing the present value of the second time counter obtained in the present cycle of the first digital clock with a previous value of the second time counter obtained in a previous cycle of the first digital clock;
if the present value and the previous value of the second time counter are equal, decreasing the variable increment amount by a predetermined amount to obtain the updated increment amount; and
if the present value and the previous value of the second time counter are not equal, increasing the variable increment amount by the predetermined amount to obtain the updated increment amount.

28. The method of claim 24, wherein updating the variable increment amount to provide the updated increment amount comprises:
calculating the updated increment amount by dividing a number of second digital clock cycles during a measurement period by a number of first digital clock cycles during the measurement period, to obtain the updated increment amount, to obtain an average number of second digital clock cycles elapsed per first digital clock cycle over the measurement period.

29. The method of claim 24, wherein updating the variable increment amount to provide the updated increment amount comprises:
comparing the present value of the second time counter obtained in the present cycle of the first digital clock with a previous value of the second time counter obtained in a previous cycle of the first digital clock; and
providing variation information to a digital loop filter based on the comparing of the present value and the previous value of the second time counter, wherein the digital loop filter is configured to determine the updated increment amount based on the variation information.

* * * * *